United States Patent [19]
Farrar

[11] 3,830,657
[45] Aug. 20, 1974

[54] METHOD FOR MAKING INTEGRATED CIRCUIT CONTACT STRUCTURE

[75] Inventor: Paul A. Farrar, South Burlington, Vt.

[73] Assignee: International Business Machines Corporation, Armonk, N.Y.

[22] Filed: June 30, 1971

[21] Appl. No.: 158,467

[52] U.S. Cl. ............. 117/217, 117/107, 317/234 L, 317/234 M
[51] Int. Cl. ............ B44d 1/18
[58] Field of Search .... 317/234 L, 234 M; 117/217, 117/107

[56] References Cited

UNITED STATES PATENTS

| | | | |
|---|---|---|---|
| 2,995,473 | 8/1961 | Levi | 117/212 |
| 3,300,340 | 1/1967 | Calandrello et al. | 117/217 |
| 3,408,733 | 11/1968 | Arnold et al. | 317/234 M |
| 3,567,509 | 3/1971 | Kuiper | 117/217 |
| 3,631,304 | 12/1971 | Bhatt | 317/234 M |
| 3,631,305 | 12/1971 | Bhatt et al. | 317/234 M |

OTHER PUBLICATIONS

Chemical Abstracts, Subject Index, 7th Collective Index, American Chemical Society, Columbus, Ohio, 1969, p. 1,307S.
Ames et al., Reduction of Electromigration in Aluminium Films by Copper Doping, in IBM J. Res. Develop., July 1970, pp. 461–463.

*Primary Examiner*—Cameron K. Weiffenbach
*Attorney, Agent, or Firm*—Howard J. Walter, Jr.

[57] ABSTRACT

An electrical interconnection contact structure including a layer containing a major proportion of an intermetallic compound contacting the surface of an integrated circuit device. The intermetallic layer is covered by a layer of conductive alloy which includes a major proportion of a solid solution of the same chemical elements as the intermetallic compound. One of the chemical elements is preferred to be an electromigration preventing dopant. Two methods of creating such a contact structure are disclosed including a sandwich technique where a layer of a first element and a layer of a second element form the intermetallic compound and a co-deposition technique where the first and second elements are co-deposited as the intermetallic compound. An alternative embodiment includes causing the intermetallic layer to spheroidize after exposure to high temperature stress allowing the major ingredient of the overlying layer to contact the semiconductor surface between spheroids. The invention provides an effective method of controlling spiking of shallow semiconductor junctions while improving the electromigration characteristics of the conductive member.

15 Claims, 5 Drawing Figures

INVENTOR
PAUL A. FARRAR

BY Howard J Walter Jr.
ATTORNEY

METHOD FOR MAKING INTEGRATED CIRCUIT CONTACT STRUCTURE

BACKGROUND OF THE INVENTION

1. Field of the Invention

This invention relates to the manufacture of semiconductor devices and more particularly to the structure and methods of manufacturing ohmic contacts and other conductive members for such devices.

2. Description of the Prior Art

Conductive members are necessary elements in integrated circuit structures to allow connection between various devices on a single semiconductor substrate and between devices and external circuitry. With increasing miniaturization of integrated circuit components, the role of interconnection technology has become increasingly more complex. In the early developmental stages of the art discrete wiring, comprising essentially pure conductors, was found suitable for interconnections and was usually chosen only for electrical properties. For example, such conductors as gold, silver, copper and aluminum were used extensively.

Interconnection metallurgy, to be effective, must have two primary properties. It must have good electrical conductivity and must make good ohmic contact with semiconductor elements. In addition, the metallurgy used must also have good thermal, chemical and mechanical properties.

Each of the above requirements have become critical with the advent of microminiaturized integrated circuitry. No longer may conductors be selected by virtue of electrical properties alone. Not only are the materials limited but new problems have arisen. For example, when dealing with extremely thin conductors, on the order of thousands of angstrom units in thickness, problems such as current-induced mass transport, or electromigration, may cause conductors to physically fail through the occurance of cracks in the conductor surface.

In planar semiconductor devices, a silicon oxide coating usually overlies the silicon surface except in the contact areas. This coating serves to passivate the semiconductor surface and to provide an insulating base for expanded contacts and interconnections. In integrated circuits, strips of conductor material extend from one semiconductor region to another over the oxide coating. Accordingly, the conductor must exhibit good adhesion to the semiconductor, as well as to the oxide coating, and must not produce any undesirable reaction or penetrate either the semiconductor, or coating.

For example, one problem, found particularly with aluminum conductors, is that of spiking into shallow diffused areas to which contact must be made. The spiking occurs during the exposure of the device structure to relatively high thermal-time stress experienced by high temperature operations such as in applying the conductors, bonding leads to, or in applying protective glass layers to, completed circuitry. It is believed that due to the solubility of silicon in aluminum the exchange of aluminum for silicon takes place allowing spikes of aluminum-rich alloy to penetrate into the silicon surface. This problem is particularly troublesome as the thickness of diffusions decrease, or become shallower.

A great deal of prior art concerning the problem of electromigration and spiking exists. For example, methods of controlling electromigration are presented by Ainslie et al. in U.S. Pat. No. 3,474,530 entitled "Mass Production of Electronic Devices" and Ames et al. in U.S. Pat. No. 3,725,309 entitled "Copper Doped Aluminum Conductive Stripes" both assigned to the assignee of the instant invention. Although the methods disclosed appear to reduce the problem of electromigration while still maintaining an acceptable level of conductivity, adhesion properties etc., they do not aid in the solution of aluminum spiking problems.

Several prior art methods for the reduction of spiking have been presented by the prior art. These may be generally categorized into four groups as follows.

A first group includes those methods which provide a metallurgical barrier to silicon solubility. There are two distinct types of barriers used. The first type comprises addition of a layer of a metallic element, in addition to the silicon and the primary conductor, which has a very low affinity for silicon, that is the metal in direct contact with silicon acts as a physical diffusion barrier. Metals such as titanium, chromium, molybdenum or tungsten have been suggested for such purposes. The second type of barrier comprises an intermetallic compound composed of an element, such as platinum, and the semiconductor to form a silicide, or composed of two elements such as palladium and aluminum to form PdAl, $PdAl_3$, or $Pd_3Al$. Each of the above techniques has the disadvantage of requiring extra processing steps. In addition, the use of a single metallic element presents difficult etching problems while the use of the proposed intermetallic compounds may alter the electromigration properties of the conductor. A further problem presented by methods in this group is that the addition of a metal, or metallurgical compound, as a barrier has the effect of changing the work function between the primary conductor and an oxide coating, such as the gate of an MOSFET. Examples of methods in this group are taught by U.S. Pat. No. 3,461,357 to Mutter et al., IBM Tech. Disc. Bull., Vol. 10, No. 11, April 1968, page 1709 and IBM Tech. Disc. Bull., Vol. 10, No. 12, May 1968, page 1979.

A second group comprises techniques in which silicon is pre-saturated in the primary conductor prior to high temperature stressing to reduce the solubility driving force between, for example, aluminum and silicon. These methods may be accomplished as taught by Kuiper in U.S. Pat. No. 3,567,509 and IBM Tech. Disc. Bull., Vol. 13, No. 12, May 1971, page 3661. Among the disadvantages of these methods are the additional steps and materials necessary, the difficulty in forming the proper amount of such composition and the resulting decrease in electrical conductivity of the conductor.

A third group comprises methods which teach the use of an intermediate ohmic contact comprising an alloy having a metal therein with a higher solubility for thhe conductor than does silicon, thereby reducing the aluminum-silicon driving force. In these methods it is necessary to insure that none of the added metal, such as aluminum, is available for diffusion with silicon. This may be accomplished either by calculating the quantity of added metal needed or by removing the excess, for example see Castrucci et al. U.S. Pat. No. 3,558,352. These methods, although useful, require additional processing steps.

A fourth group comprises those methods which rely on control of process parameters during deposition of the conductor. For example, by applying a small quantity of conductor at a high temperature followed by deposition of the remainder of material at a low temperature spiking may be reduced. See Perri et al. U.S. Pat. No. 3,574,680. One difficult problem with these methods is that customary deposition apparatus, as in vapor deposition, is incapable of consistently operating at the high temperatures needed to implement these methods. In addition, these methods do not preclude spiking caused by subsequent high temperature processing.

In summary, the prior art presents various techniques for improving interconnection metallurgy by separatly reducing aluminum spiking and electromigration, but each generates at least one additional disadvantage which makes the techniques of the prior art undesirable.

SUMMARY OF THE INVENTION

It is a primary object of this invention to provide improved conductive members for integrated circuit structures by reducing the formation of spiking into semiconductor diffusions.

Another object of this invention is to reduce spiking in semiconductor devices while at the same time reducing the number of materials and steps necessary in the manufacturing process.

It is a further object of this invention to improve the electromigration properties of aluminum conductors while at the same time reducing aluminum spiking into semiconductor junctions.

These and other objects are accomplished by the instant invention, which briefly comprises the structure of an integrated circuit interconnection member and semiconductor device contact utilizing a layer of intermetallic compound in contact with the semiconductor device to act as a diffusion barrier to prevent spiking of aluminum. This layer is covered by a second layer of a metallic alloy containing the same chemical elements as the intermetallic compound wherein the net proportion of chemical elements in the overall structure is adjusted to achieve optimum electromigration chracteristics. Two methods are provided for making such a structure and include a sandwich technique in which layers of essentially pure metal are deposited having a thickness corresponding to the required stoichiometric ratio to provide the desired intermetallic compound after the layers reach equilibrium. Thereafter, a subsequent layer of conducting material is applied. This last layer may contain a quantity of a second element such that the overall weight percentage of the materials used provides substantially improved electromigration characteristics for the contact structure. A second method including the step of co-depositing a stoichiometric ratio of metals to provide the intermetallic compound layer is also provided. In addition,, a modified structure of the above-described contact is disclosed wherein the intermetallic compound layer is caused to spheroidize allowing the overlying conductive layer to contact the semiconductor surface between spheroids such that a desired work function between the conductive member and the surface may be maintained. It will be recognized that in utilizing the structure of the instant invention that spiking of conductive materials into semiconductor junctions may be substantially reduced while at the same time optimum electromigration characteristics of conductive members may be maintained without the necessity of additional materials, process steps, or cost.

The foregoing and other objects, features and advantages of the invention will be apparent from the following more particular description of the preferred embodiments of the invention, as illustrated by the accompanying drawings.

DESCRIPTION OF THE PREFERRED EMBODIMENTS

In the manufacture of monolithic integrated circuit structures it has become essential to use metallic interconnection members to provide interconnection between various devices and to provide external connection to circuit utilization devices. Aluminum and its alloys, because of their desirable electrical, chemical, thermal and physical properties, have become the preferred interconnection material. Normally in the manufacture of such structures, as described by Agusta et al. U.S. Pat. No. 3,508,209, issued Apr. 21, 1970 and assigned to the assignee of the instant invention, it is preferred to apply a protective glass coating over the completed monolithic structure. Glass coating methods are typically illustrated by the methods of Pliskin et al. in U.S. Pat. Nos. 3,212,921 and 3,212,929, issued Oct. 19, 1965 and Davidse et al. U.S. Pat. No. 3,369,991, issued Feb. 14, 1968, all assigned to the assignee of the instant invention. The glassing methods require exposure of the semiconductor structure, including conductive metallurgy thereon, to much higher temperatures than would be normally expected during the lifetime of the circuit, on the order of 300°–650°C. It is at these higher temperatures that the problem of aluminum spiking into shallow diffusions has been found to cause significant problems.

At high temperatures necessary for glassing operations the solubility of silicon in a conductor, for example aluminum, may increase to a point where silicon is found to displace the material of the conductor causing conductive spikes to form which may extend completely through shallow surface diffusions causing failures. For a more complete description of the spiking problem, reference may be had to U.S. Pat. No. 3,567,509 referred to previously.

Figure 1:
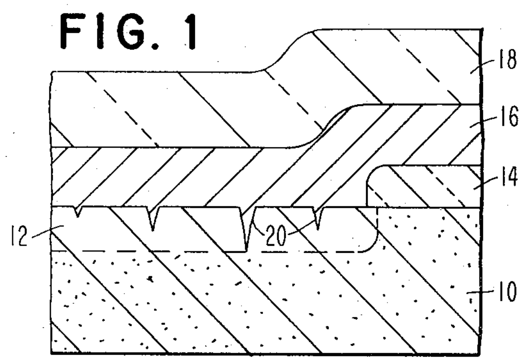
PRIOR ART FIG. 1
FIG. 1 shows a detailed sectional view of a planar semiconductor device of the prior art illustrating the undesirable spiking caused by a conductive member overlying a shallow diffusion.

Referring now to FIG. 1 there is shown a sectional view of a planar semiconductor device of the prior art which comprises a wafer 10 of semiconductor material into which a shallow surface diffusion 12 has been formed by methods well known in the art. A dielectric layer, or protective oxide 14, usually silicon dioxide, selectively covers the surface of wafer 10 defining various semiconductor elements and passivating the surface of the water. In order to make electrical contact to the diffused junction a conductive member 16, for example aluminum, aluminum alloy or other conductive material, is selectively applied over the surface of the semiconductor structure and a contact is formed at the interface between diffusion 12 and conductive member 16. Idealy, it is preferred that the interface remain ohmic and planar to provide reproducable device characteristics. However, it has been found that upon the application of a glassing layer 18 at elevated temperatures undesirable aluminum spikes 20 may form, as referred to previously. Although the prior art referred to above has proposed various techniques to prevent spiking, none have proven to be entirely satisfactory.

In addition to the spiking problem another independent problem effects the quality of the extremely thin conductors used to make interconnections for monolithic circuitry. This problem is electromigration. For example, it has been found that for conductors on the order of a few microns in thickness electromigration causes physical breakdown in the form of cracks to appear in the conductor resulting in ultimate failure of the circuit. This phenomena, referenced previsouly, is described, and remedies are proposed, in the patent to Ainslie et al. A particular remedy taught by the Ames et al. patent, cited above, includes the addition of specified amounts of copper dopant added to an aluminum conductor. However, while copper doped aluminum has been found beneficial in preventing electromigration such addition of copper as taught by the prior art has little effect on the problem of aluminum spiking. One of the facts known as a result of the teachings of Ainslie et al. and Ames et al. is that due to the thickness of the conductive member being only a few grains thick it makes little difference exactly where the copper dopant is placed physically with respect to the aluminum. For example, a copper layer placed in sandwich fashion between two equal thickness layers of aluminum, on the order of 3,000 angstrom units in thickness each, has been found to provide the same electromigration protection as when copper-doped aluminum is deposited as a single homogeneous layer.

The instant invention allows for the practical elimination of both aluminum spiking and electromigration by the novel structure and method set out below.

Figure 2:
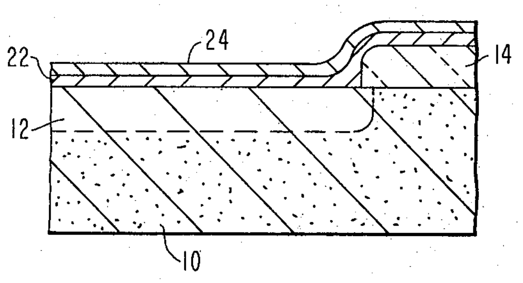
FIG. 2 is a sectional view of a partially fabricated device similar to that of FIG. 1 showing the first two metallic layers applied as taught by the instant invention.

Referring now to FIG. 2,, there is shown a sectional view of a semiconductor device similar to that shown in FIG. 1, like reference characters being used to illustrate identical elements. The manufacturing process of Agusta et al., previously referred to,, may be utilized, for example, to form the structure defined by wafer 10, diffusion 12 and protective oxide 14. There is provided in accordance with this invention a thin continuous layer 22 comprising a first element overlying and bonded to the surface of the semiconductor structure. Overlying and bonded to layer 22 is a second thin continuous layer 24 comprising a second element. The elements forming layers 22 and 24 are selected by two criteria. The first criterion is that one, usually a metal, must be a suitable conductor and the other, usually a metal but not necessarily so, must be a suitable dopant known to improve the electromigration characteristics of that conductor. The second criterion is that the elements must form an intermetallic compound phase material. Examples of such elements are aluminum-copper, aluminum-iron and aluminum-chromium. Either element may be deposited as layer 22 or 24. For example, layer 22 may be aluminum and layer 24 may be copper. The relative amount of the first and second elements should preferably be in the stoichiometric ratio necessary to form the desired intermetallic compound. For example, if the intermetallic compound desired is $Al_2Cu$ the stoichiometric ratio is 45.9 percent by weight aluminum and 54.1 percent by weight copper.

After deposition of layers 22 and 24, an intermetallic compound layer 26 (FIG. 3) is formed by causing the two layers 22 and 24 to come to equilibrium. Depending upon the thickness of the layers, this may occur almost spontaneously during the deposition process or may be assisted by exposing the structure to an elevated temperature for a short period of time. Formation of the intermetallic compound may also be carried out simultaneously with subsequent high temperature processing steps, such as the above referred to glassing step. The last method is feasible if the equilibrium constant for the formation of the intermetallic compound is larger than the diffusion constant of silicon which causes spiking. Allowing layers 22 and 24 to come to equilibrium causes the formation of an alloy layer 26 (FIG. 3) comprising a major proportion, and preferably consisting of, the intermetallic phase with little, or no, solid solution present, as will be made clearer from the discussion of FIG. 5.

It will be realized by those skilled in the art that the thickness of intermetallic layer 26 must be determined for each specific case taking into account the properties of the materials used as well as the time-temperature stress to be experienced during subsequent processing steps.

Figure 3:
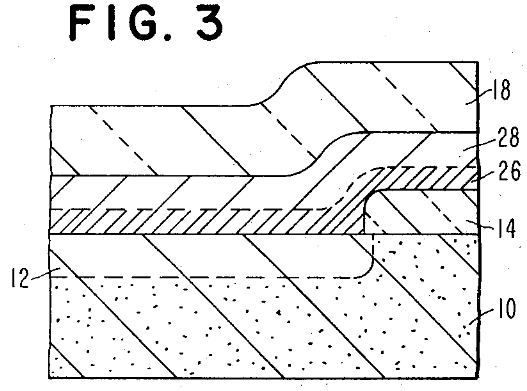
FIG. 3 is a sectional view of a completed device near the end of a high temperature processing step showing the protective intermetallic compound layer which acts as a barrier to spiking.

Referring to FIG. 3, subsequent to the deposition of the elements to form the intermetallic compound, a conductive layer 28 is applied overlying and bonded to layer 24, or intermetallic layer 26, depending upon which of the above procedures are followed. For example, layer 28 may be substantially pure aluminum deposited to a thickness such that the overall thickness of the interconnection member is as thick as necessary depending upon circuit design specifications. Alternately, layer 28 may comprise a doped metallic layer containing a sufficient amount of dopant to bring the total dopant percentage in the interconnection member to the desired amount for optimum electromigration characteristics. For example, if layer 26 is a copper-aluminum intermetallic compound and the predetermined thickness of that layer contains insufficient copper to provide the proper electromigration characteristics for the overall interconnection member, it will be necessary to add a small additional amount of copper to the aluminum conductive layer 28 to bring the total percentage of copper to the desired amount.

Alternately, intermetallic compound layer 26 may be applied by a co-deposition technique wherein both first and second elements are deposited simultaneously in the required stoichiometric ratio to form the intermetallic compand.

It will be realized by those skilled in the art that the particular method of deposition is not critical, for example, electron beam, RF heating filament evaporation or sputtering may be used to deposit any of the layers forming the conductive member.

After deposition of conductive layer 28 subsequent high temperature processing steps may be carried out safely without appreciable spiking occuring in the diffusion area. For example, glass may be be applied by either of the two methods previously discribed to provide a fused glass layer 18. It is during the subsequent high temperature processing steps that benefit of the subject invention will be realized.

Figure 4:
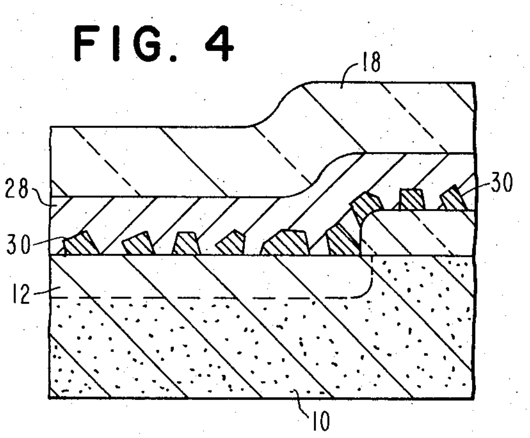
FIG. 4 is a sectional view of a completed device fabricated in accordance with a modification of the instant invention illustrating the presence of spheroids of intermetallic compound at the surface of the semiconductor device allowing the conductive member to contact the device surface between spheroids.

The intermetallic compound present on the surface of the semiconductor structure during high temperature processing steps acts as a diffusion barrier preventing the silicon from dissolving into the contact member. However, due to the non-uniform distribution of the metals in the conductive member prolonged exposure at high temperature tends to cause the entire member to reach equilibrium thereby changing the proportion of intermetallic compound present at the surface of the semiconductor. In addition, the metallurgical grain size of the conductive member increases as the metallurgical system approaches equilibrium during high temperature stress. This tends to cause the intermetallic layer to break down after a predetermined length of time making the diffusion barrier less effective. As grain size increases some alloys, including those containing aluminum, spheroidize resulting in the formation of relatively large grains of intermetallic compound at the expense of smaller adjacent grains. Full advantage may be taken of this phenomenon by intentionally providing that the thickness of the intermetallic layer 28 is less than the average equilibrium grain size formed by spheroidization. As shown in FIG. 4, a point is reached where spheroids 30 of the intermetallic compound reach an average grain size greater than the thickness of the original intermetallic layer causing layer 26 (FIG. 3) to become discontinuous. Once discontinuity occurs the material comprising layer 28 fills the spaces between spheroids 30 effectively allowing layer 28 to contact the semiconductor surface at diffusion 12 and at the surface of protective oxide 14. This results in creating a contact potential or work function between conductive layer 28 and the semiconductor structure rather than between intermetallic layer 26 and the surface of the semiconductor. Achieving the desired work function for contact metallurgy in manufacturing devices such as Schottky diodes (metal-semiconductor contact) and gate contacts (metal-dielectric contact) for MOSFET devices may be extremely critical to device operation.

Those skilled in the art will recognize that the diffusion barrier properties of the intermetallic layer will be lost upon allowing spheroidization to take place when utilizing the critical intermetallic layer thickness. However, a trade-off may be made such that if spheroidization is desired it occurs close enough to the end of any high temperature process so as to produce only an acceptable amount of spiking while at the same time allowing the benefits of spheriodization to be utilized.

In order to more particularly describe the preferred embodiment of the invention, an application of the above teaching will be illustrated by evaluating the metallurgical system of an interconnection member comprising aluminum and copper.

Figure 5:
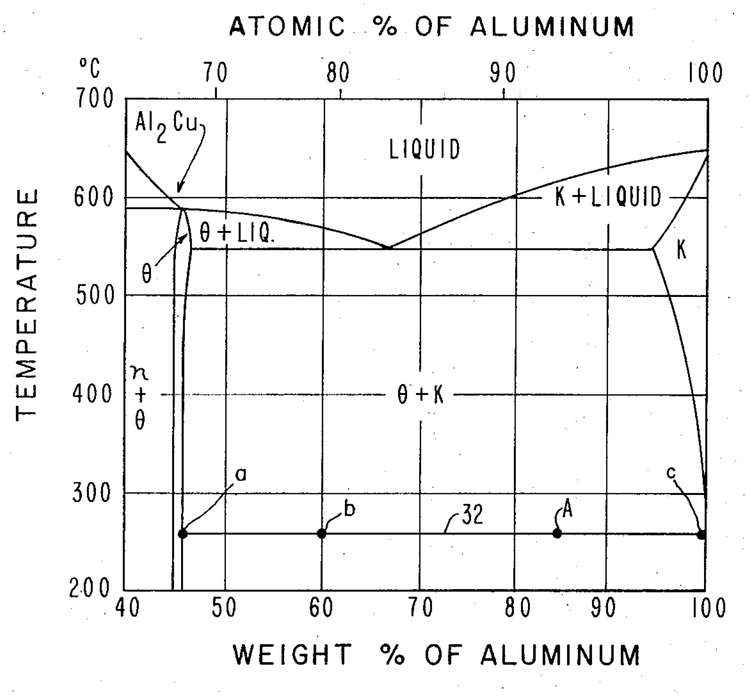
FIG. 5 is a portion of the equilibrium diagram for the binary system of aluminum-copper illustrating the preferred operating range of one embodiment of the instant invention.

Referring now to FIG. 5 there is shown a portion of the aluminum-copper equilibrium diagram. The equilibrium diagram graphically shows the phases present in copper containing aluminum alloys at equilibrium. There are two separate solid phases which are of primary interest. The first is kappa () which represents a solid solution of copper dissolved in aluminum. That is, both aluminum and copper are present in a single phase with the crystal structure of pure aluminum. The second phase is theta ($\theta$) which represents the intermetallic compound phase $Al_2Cu$.. As can be seen in FIG. 5 the presence of either or both phases may occur depending upon the net percentage of copper present in the alloy at equilibrium. In the central portion of FIG. 5 both $\theta$ and  are present in a two-phase composition.

The relative proportions of theta and kappa present at any one temperature, for example at isotherm abAC, may be determined by visual inspection or by the use of a so-called "lever" rule. For example, an alloy of 46 weight percent aluminum would be all theta phase, or $Al_2Cu$, while a 99 weight percent aluminum alloy would be almost all kappa phase (pure aluminum with a small percentage of copper dissolved therein) plus a very small percentage of theta phase. The lever rule provides that the proportions of each phase present in a two phase portion of the equalibrium diagram is determined, for example at 60 weight percent aluminum, by the ratios, (c-b)/(c-a) for theta and (b-a)/(c-a) for kappa, or 40/54 = theta and 14/54 = kappa. It will be recognized by those skilled in the art that at equilibrium the phases present will exist in the proportions determined from the equilibrium diagram but need not necessarily be uniformly distributed throughout the entire alloy system. For example, a conductor structure of this invention may be in equilibrium even though separate layers of different phases exist.

Referring again to FIG. 2 and assuming, for example, that first layer 22 comprises aluminum and second layer 24 comprises copper, deposited in the stoichiometric ratio previously described, it is apparent that these layers at equilibrium will result in the eventual formation of a layer of pure theta phase, or $Al_2Cu$, i.e., layer 26 of FIG. 3. The extreme thinness of these layers, on the order of 1,000 angstrom units thickness, enables equilibrium to be reached rather quickly due to the close proximity of even the most remote atoms in each layer from top to bottom (approximately 2,000 angstrom units).

However, in order to achieve the desired electromigration properties a total copper percentage of about 15 weight percent is preferred in the overall composition of the conductive member, as represented by point A on the isotherm. This requirement may be established by applying a third layer 28 of pure aluminum to a thickness of about 6,000 angstrom units as determined by a straight forward weight percentage calculation. The overall structure will now have a thickness of about 8,000 angstrom units which will take a considerably longer time to reach equilibrium than will layers 22 and 24. Of course, if a thicker overall structure is required layer 28 should comprise both aluminum and a small percentage of copper. However, the period of time necessary for the net composition to reach equilibrium is in general less than the period required for layer 26 to spheroidize. Therefore, spheroidization takes place after equilibrium is reached. Because of this the structure of FIG. 4 showing spheroids 30 of $Al_2Cu$ forms after the formation of the two phase system defined by point A of FIG. 5.

The following examples will serve to illustrate the results of the instant invention.

Samples were prepared by the above described sandwich technique utilizing a net copper content of 9 and 15 weight percent wherein the copper was vapor deposited at about 200°C directly on the exposed surface of (100) silicon wafers. The total conductor thickness was about 12,000 angstrom units. After heat treatment at 450°C for one hour, penetration studies indicated only 9,000 angstrom units penetration for the 15 percent sample while standard copper-doped aluminum, applied as taught by the prior art, penetrated 11,300 angstrom units. Electromigration studies on these samples at $1.5 \times 10^6$ amp/cm$^2$ at 150°C resulted in a mean time to failure of 5,630 hours as compared to approximately 140 hours for a similar conductor having the preferred copper doped aluminum composition of the prior art. These results indicate that the 15 percent alloy produced in accordance with the instant invention provides an effective diffusion barrier for at least 1 hour at 400°C, a time-temperature relationship suitable for glassing by the sputtering technique of Davidse et al. Electromigration properties are considerably improved over the preferred compositions of the prior art.

It should be recognized that although the prior art teaches that for interconnection members containing copper, copper layers may not be placed directly in contact with silicon surfaces without resulting "copper poisoning," practice of the instant invention allows such a procedure without adverse effects. In fact, the results of the instant invention are considerably improved due to the formation of the copper intermetallic which effectively controls the penetration of copper into the silicon.

While the invention has been particularly shown and described with reference to preferred embodiments thereof, it will be understood by those skilled in the art that the foregoing and other changes in form and details may be made therein without departing from the spirit and scope of the invention.

What is claimed is:

1. The method of making a conductive metallurgical member for contacting a predetermined area of the surface of a silicon semiconductor device, comprising the steps of:

despositing a first and second metal over said predetermined area of said semiconductor device, said first metal being aluminum and said second metal being selected from the group consisting of chromium, copper, and iron, the proportions of said first and second metals being in a ratio to form an intermetallic compound to act as a diffusion barrier to silicon;

causing said first and second metals to substantially come to equilibrium to form an alloy layer over said predetermined area, said alloy layer comprising an intermetallic compound of aluminum and said second metal; and depositing a continuous metallic layer on said alloy layer, said continuous metallic layer substantially comprising a solid solution phase of said second metal in aluminum.

2. The method of claim 1 wherein said first and second metals are sequentially deposited on the surface of said semiconductor device.

3. The method of claim 2 wherein said second metal is deposited prior to the deposition of said first metal on the surface of said semiconductor device.

4. The method of claim 2 wherein said second metal is copper.

5. The method of making interconnection metallurgy for contacting the surface of a silicon semiconductor device, comprising the steps of:

co-depositing aluminum and an element selected from the group consisting of chromium, copper, and iron to form a first layer on the surface of said semiconductor device of an intermetallic compound to provide a diffusion barrier to silicon, and then depositing a second layer of conductive material on said first layer, and second layer being of a different composition than said first layer and comprising a substantial portion of aluminum and a minor portion of said element.

6. The method of claim 5 wherein said element is copper and said first layer is about 1,000 to 2,000 angstrom units thick and further including the additional step of:

heating the resulting structure to a temperature in excess of 200°C to cause said intermetallic compound to spheriodize discontinuously causing said second layer to contact the surface of said semiconductor device.

7. The method of claim 5 whereln said element is copper.

8. A method of providing an intermetallic diffusion barrier to prevent spiking of metallic contact members into shallow diffusion areas on the surface of a partially dielectric-masked silicon semiconductor device during high temperature processing steps subsequent to applying said contact member, while maintaining improved electromigration properties of said contact member and while further maintaining a desired work function between said contact member and the contacted surface of said semiconductor device, comprising the steps of:

providing a thin continuous layer of an intermetallic compound phase material on the surface of said silicon semiconductor device, said intermetallic compound comprising aluminum and a metal selected from the group consisting of chromium, copper, and iron;

providing a conductive layer of aluminum containing said metal to provide a total amount of said metal in said intermetallic and said conductive layers equal to a predetermined total percentage known to improve the electromigration properties of said contact member; and exposing said semiconductor structure to a high temperature process for a sufficient period of time to spheroidize said intermetallic layer causing said layer to become discontinuous and allowing said conductive layer to contact portions of the surface of said semiconductor device which are not covered by said discontinuous layer.

9. The method of claim 8 wherein said metal is copper.

10. The method of claim 9 wherein said layer of intermetallic compound phase material is about 1,000 to 2,000 angstrom units thick.

11. A method of providing an intermetallic diffusion barrier to prevent spiking of metallic contact members into shallow diffusion areas on the surface of a partially dielectric-masked silicon semiconductor device during high temperature processing steps subsequent to applying said contact member, while maintaining improved electromigration properties of said contact member and while further maintaining a desired work function between said contact member and the contact surface of said semiconductor device, comprising the steps of:

providing a thin continuous layer of an intermetallic compound phase material on the surface of said silicon semiconductor device, said intermetallic compound comprising aluminum and copper and having the formula $Al_2Cu$;

providing a conductive layer of aluminum containing copper on said continuous layer, a total amount of copper in said intermetallic and conductive layers equal to a predetermined total percentage known to improve the electromigration properties of said contact member; and exposing said semiconductor structure to a high temperature process for a sufficient period of time to spheroidize said intermetallic layer causing said layer to become discontinuous and to allow said conductive layer to contact the surface of said semiconductor device through discontinuities in said intermetallic layer.

12. The method of claim 11 wherein the total amount of copper in said intermetallic and said conductive layers equals about 15 weight percent.

13. The method of making a conductive metallurgical member for contacting a predetermined area of the surface of a silicon semiconductor device, comprising the steps of:

depositing aluminum and copper over said predetermined area of said semiconductor device, the proportions of aluminum and copper being in a ratio to form the intermetallic compound $Al_2Cu$ to act as a diffusion barrier to silicon;

causing said aluminum and copper to substantially come to equilibrium to form an alloy layer comprising said intermetallic compound; and depositing a continuous metallic layer on said alloy layer, said continuous metallic layer substantially comprising a solid solution phase of copper in aluminum.

14. The method of claim 13 wherein the amount of copper in said member is about 15 weight percent.

15. The method of making interconnection metallurgy for contacting the surface of a silicon semiconductor device, comprising the steps of:

co-depositing aluminum and copper in a stoichiometric ratio to form a first layer of the intermetallic compound $Al_2Cu$ on the surface of said semiconductor device to provide a diffusion barrier to silicon; and depositing a second layer of conductive material on said first layer, said second layer being of a different composition than said first layer and comprising a substantial portion of aluminum and a minor portion of copper.

* * * * *